(12) United States Patent
Gulick

(10) Patent No.: US 6,766,347 B1
(45) Date of Patent: *Jul. 20, 2004

(54) SYSTEM AND METHOD FOR PROVIDING A REMOTE USER WITH A VIRTUAL PRESENCE TO AN OFFICE

(75) Inventor: Dale E. Gulick, Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,168

(22) Filed: Jun. 9, 1998

(30) Foreign Application Priority Data

May 28, 1997 (DE) .......................................... 197 22 483
May 23, 1998 (DE) .......................................... 198 18 292

(51) Int. Cl.[7] .................................................. G06F 9/00
(52) U.S. Cl. ...................................................... 709/103
(58) Field of Search ................................ 709/103, 100, 709/102, 104, 107; 710/52–57, 100–103

(56) References Cited

U.S. PATENT DOCUMENTS

| | | | |
|---|---|---|---|
| 5,168,566 A | | 12/1992 | Kuki et al. |
| 5,247,677 A | * | 9/1993 | Welland et al. ............. 709/103 |
| 5,361,362 A | * | 11/1994 | Benkeser et al. ........... 709/102 |
| 5,404,463 A | | 4/1995 | McGarvey |
| 5,437,039 A | | 7/1995 | Yuen |
| 5,487,170 A | | 1/1996 | Bass et al. |
| 5,528,513 A | * | 6/1996 | Vaitzblit et al. ............. 709/103 |
| 5,640,595 A | | 6/1997 | Baugher et al. |
| 5,675,811 A | * | 10/1997 | Broedner et al. ........... 713/323 |
| 5,724,587 A | | 3/1998 | Carmon et al. |
| 5,742,825 A | * | 4/1998 | Mathur et al. ............... 709/300 |
| 5,758,105 A | | 5/1998 | Kelley et al. |
| 5,798,969 A | | 8/1998 | Yoo et al. |
| 5,815,678 A | | 9/1998 | Hoffman et al. |
| 5,822,568 A | * | 10/1998 | Swanstrom ............ 395/500.45 |
| 5,832,492 A | * | 11/1998 | Wooten |
| 5,845,065 A | | 12/1998 | Conte et al. |
| 5,850,559 A | | 12/1998 | Angelo et al. |
| 5,892,904 A | | 4/1999 | Atkinson et al. |
| 5,895,482 A | | 4/1999 | Toda |

(List continued on next page.)

*Primary Examiner*—Zarni Maung
*Assistant Examiner*—George L. Opie
(74) *Attorney, Agent, or Firm*—Robert C. Kowert; Meyertons, Hood, Kivlin, Kowert & Goetzel, P.C.

(57) ABSTRACT

A computer system includes a real-time interrupt that causes the operating system to determine which isochronous tasks are pending. In one embodiment, applications that include isochronous tasks are certified to be well-behaved and the operating system will only initiate applications that are known to be well-behaved by checking a list of certified applications. The operating system will not initiate an application if insufficient resources are available for executing the tasks of the application. Each application informs the operating system of an execution rate and a maximum duration of its isochronous tasks. Prior to initiating an application, the operating system verifies that resources are available to execute the isochronous tasks of the application. The operating system includes a non-maskable interrupt to terminate isochronous tasks. Termination may be necessary if an isochronous task fails to execute within its specified maximum duration. Alternatively, an isochronous task may be preempted to execute a higher priority task. The operating system may include two types of time-slices. Higher priority tasks are allocated to quick slices and lower priority tasks are allocated to standard slices. Standard slices are preemptable and quick slices are not preemptable.

13 Claims, 7 Drawing Sheets

U.S. PATENT DOCUMENTS

| | | | | |
|---|---|---|---|---|
| 5,903,752 A | * | 5/1999 | Dingwall et al. | 709/103 |
| 5,918,073 A | | 6/1999 | Hewitt | |
| 5,961,585 A | | 10/1999 | Hamlin | |
| 5,995,745 A | * | 11/1999 | Yodaiken | 395/500.47 |
| 6,061,411 A | | 5/2000 | Wooten | |
| 6,067,334 A | | 5/2000 | Bostica et al. | |
| 6,092,095 A | * | 7/2000 | Maytal | 709/100 |
| 6,148,322 A | | 11/2000 | Sand et al. | |
| 6,223,201 B1 | | 4/2001 | Reznak | |

* cited by examiner

SYSTEM AND METHOD FOR PROVIDING A REMOTE USER WITH A VIRTUAL PRESENCE TO AN OFFICE

BACKGROUND OF THE INVENTION

1. Field of the Invention

The present invention relates to operating systems, and more particularly, to processing isochronous data by general-purpose operating systems.

2. Description of the Related Art

Computer systems, such as personal computer systems, were originally developed for business applications such as word processing, databases and spreadsheets, among others. Computer systems, however, are currently being used to handle a number of isochronous tasks, including: multimedia applications having video and audio components, video capture and playback, telephony applications, and speech recognition and synthesis, among others. Generally speaking, isochronous tasks are time-dependent tasks. In other words, the data handled by an isochronous task must be delivered or processed within certain time constraints. Isochronous tasks typically require some degree of precision in scheduling and execution.

One problem that has risen is that computer systems originally designed for business applications are not well-suited to the time-dependent requirements of modern multimedia applications. For example, modern personal computer system architectures still presume that the majority of applications executed on the computer system are business applications such as word processing and/or spreadsheet applications, which typically include non-time-dependent tasks. The computer systems typically implement general-purpose operating systems, which may efficiently schedule tasks, but which may not ensure the execution of a task at precise intervals as required for isochronous tasks. For example, a general-purpose operating system may not be able to guarantee the execution of a task within 100 milliseconds. This delay may be unacceptable for isochronous tasks such as audio, video and telephony. The delay may cause perceptible errors such as gaps or altered frequencies in audio signals, blank screens or lines in video signals, and echoes in telephony.

Traditionally, the central processing unit (CPU) of typical computer systems could not efficiently handle isochronous data, so isochronous tasks, such as a modem function, typically used dedicated hardware. It is desirable to modify CPUs to handle isochronous tasks so that the dedicated hardware used for isochronous tasks may be eliminated.

Some computer systems implement a real-time operating system (RTOS) to ensure precise execution of time-dependent tasks. Real-time operating systems typically include a clock which starts and stops tasks at regular intervals. The operating system may implement an interrupt which is asserted to start and stop tasks. The tasks typically include a specified rate of execution and a specified maximum duration. The operating system starts a task at the specified rate and expects the task to complete within the specified maximum duration so that a new task may be started. Unfortunately, real-time operating systems depend upon the tasks being well-behaved for correct operation. For example, if a task exceeds its specified maximum duration, the operating system may not be able to execute the next scheduled task. This situation may cause real-time operating systems to crash. In many computer systems, tasks may come from many different sources and it is difficult to guarantee that each task is well-behaved. Accordingly, real-time operating systems are not well-suited to common computing applications.

Several partially effective methods of providing real-time capability to general-purpose operating systems have been used. A general-purpose operating system is an example of a non-real-time operating system. Generally speaking, a non-real-time operating system is an operating system designed to support tasks that do not have well-defined execution durations. One method of providing real-time capability to a general-purpose operating system is to perform real-time tasks during an interrupt service routine. An interrupt causes an interrupt service routine to be executed and real-time work is done within the interrupt service routine. This method creates the problem that the code within the interrupt service routine is uninterruptable. Therefore, the operating system has no way to preempt or terminate a real-time task to initiate another task. Accordingly, if a real-time task exceeds a predetermined duration or gets locked-up, the operating system has no way to take control and may crash.

The Windows 98 operating system attempts to handle real-time and isochronous tasks by implementing a deferred procedure call. When an interrupt initiates a real-time task, the interrupt service routine is limited to gathering critical data, determining the source of the interrupt and requesting a deferred procedure call. The deferred procedure call is put in a FIFO queue. The deferred procedure calls in the FIFO queue are given highest priority by the operating system. Deferred procedure calls are preemptable so that higher priority task may be issued. Unfortunately, this method is not protected against mis-behaving software. For example, if a task initiated by a deferred procedure call disables interrupts, the operating system may not be able to preempt or terminate the task if necessary.

What is desired is a reliable way to execute isochronous tasks in a general-purpose operating system.

SUMMARY OF THE INVENTION

The present invention contemplates a computer system that includes a real-time interrupt. The real-time interrupt may cause an operating system to determine whether an isochronous task is pending. If an isochronous task is pending, the operating system executes the isochronous task. In one particular embodiment, the interrupt is derived from a master clock signal that also provides a clock signal to isochronous peripheral devices. In one embodiment, applications that include isochronous tasks are certified to be well-behaved. In one particular embodiment, applications are registered with an operating system vendor. The operating system will only initiate an application that is known to be well-behaved by checking a list of certified applications.

The operating system may not initiate an application if insufficient resources are available for executing the isochronous tasks of the application. Each isochronous task informs the operating system of an execution interval and a duration. Prior to initiating an application, the operating system verifies that sufficient resources are available to execute the isochronous tasks of the application. In one embodiment, the operating system includes a user interface. In one particular embodiment, if sufficient resources are not available to execute the isochronous tasks of an application, the operating system uses the system interface to query a user whether to suspend an existing application, to increase the percentage of operating system bandwidth allocated to isochronous tasks, or to not initiate the new application.

In one embodiment, the operating system includes a non-maskable interrupt to terminate isochronous tasks. Termination may be necessary if an isochronous task fails to completely execute within its specified duration.

In one embodiment, the operating system includes two types of time-slices. Higher priority tasks are allocated to quick slices and lower priority tasks are allocated to standard slices. Standard slices are preemptable and quick slices are not preemptable. In one embodiment, a standard slice that has been preempted may assert a flag indicating that the task has been preempted and may make the task non-preemptable the next time it is invoked.

Broadly speaking the present invention contemplates a processor, a memory coupled to the processor, interrupt generation circuitry coupled to the processor and configured to output a time-slice interrupt at a known rate, a system clock coupled to the interrupt generation circuitry, and a non-realtime operating system. The non-realtime operating system is configured to operate on the processor and to receive the time-slice interrupt. The operating system is configured to execute a pending isochronous task with a predetermined maximum execution time when the operating system receives the time-slice interrupt. The isochronous tasks are allocated to a first type of time slice or a second type of time slice. Higher priority tasks are allocated to the first type of time slice and lower priority tasks are allocated to the second type of time slice. Higher priority tasks allocated to the first type of time slice are non-preemptable and lower priority tasks allocated to the second type of time slice are preemptable.

The present invention further contemplates a personal computer including: a processor, a main memory coupled the processor, a local bus coupled to the processor, one or more isochronous peripheral devices coupled to the local bus and configured to send or receive isochronous data, interrupt generation circuitry coupled to the processor and configured to output a time-slice interrupt at a known rate, a system clock coupled to the interrupt generation circuitry, and a non-realtime operating system. The non-real-time operating system is configured to operate on the processor and receive the time-slice interrupt. The operating system is configured to execute a pending isochronous task with a predetermined maximum execution time when the operating system receives the time-slice interrupt. The isochronous tasks are allocated to a first type of time slice or a second type of time slice. Higher priority tasks are allocated to the first type of time slice and lower priority tasks are allocated to the second type of time slice. Higher priority tasks allocated to the first type of time slice are non-preemptable and lower priority tasks allocated to the second type of time slice are preemptable.

The present invention still further contemplates a method of reliably executing isochronous tasks in a non-realtime operating system comprising: determining which isochronous tasks are pending, wherein isochronous tasks are allocated to quick slice and standard slices; if a quick slice isochronous tasks is pending, executing the pending quick slice isochronous task; if no quick slice isochronous tasks are pending and a standard slice isochronous task is pending, executing the pending standard slice isochronous task; wherein the isochronous tasks have a predetermined execution time, the quick slice isochronous tasks are non-preemptable and the standard slice isochronous tasks are preemptable.

BRIEF DESCRIPTION OF THE DRAWINGS

Other objects and advantages of the invention will become apparent upon reading the following detailed description and upon reference to the accompanying drawings in which.

Figure 1:
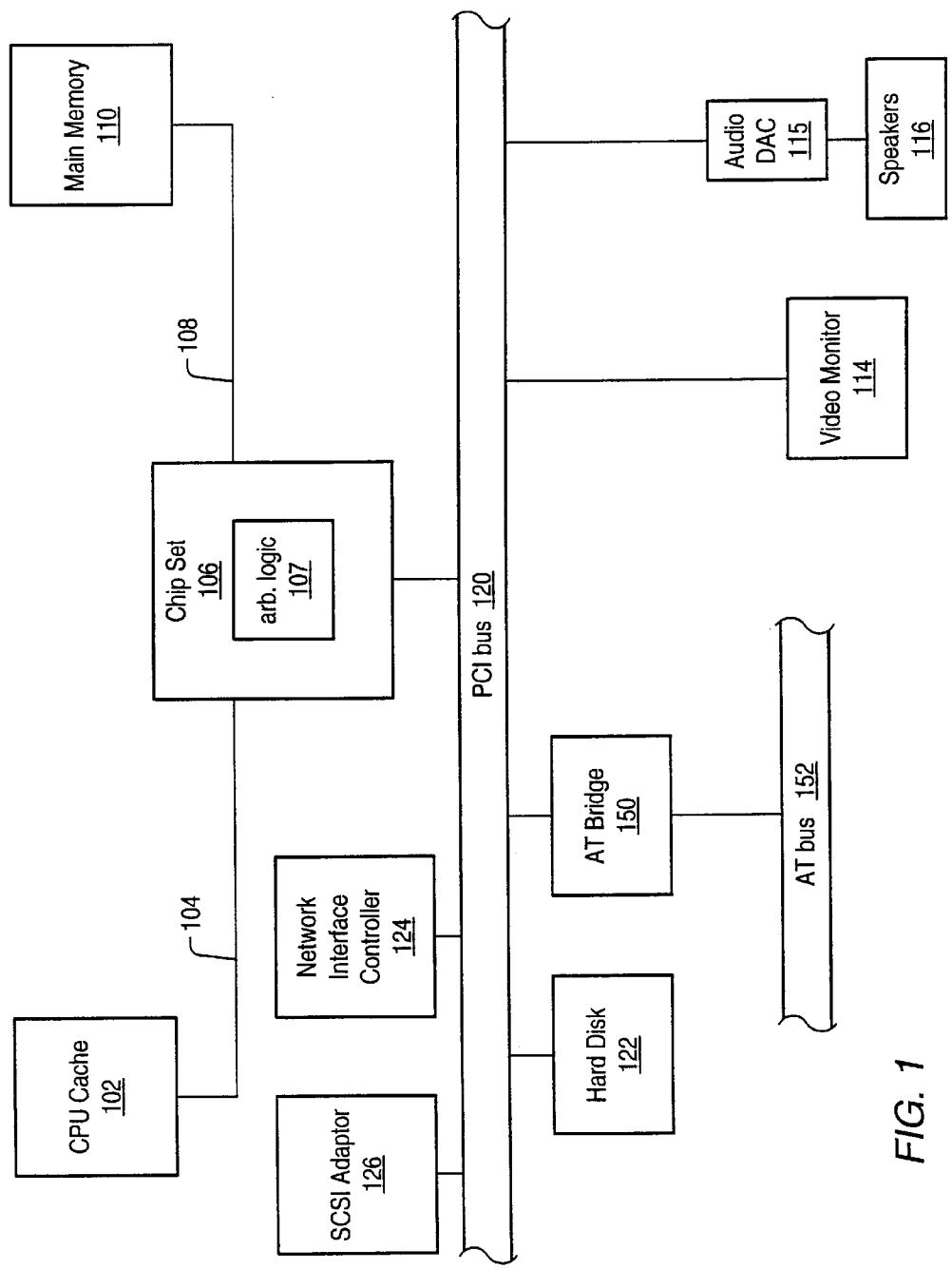
FIG. 1 is a block diagram of a computer system according to one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. For simplicity, identical and substantially similar components are given the same reference numerals throughout the drawings.

DETAILED DESCRIPTION OF THE INVENTION

Referring now to FIG. 1, a block diagram of a computer system according to one embodiment of the present invention is shown. As shown, the computer system includes a central processing unit (CPU) 102 which is coupled through a CPU local bus 104 to a host/PCI/cache bridge or chipset 106. The chipset 106 includes arbitration logic 107 as shown. In one embodiment, the chipset is the Triton chipset available from Intel Corporation. A second level or L2 cache memory (not shown) may be coupled to a cache controller in the chipset, as desired. The bridge or chipset 106 couples through a memory bus 108 to main memory 110. The main memory 110 may be SDRAM (synchronous dynamic random access memory) or other conventional memory, as desired.

The host/PCI/cache bridge or chipset 106 also interfaces to a local bus such as the peripheral component interconnect (PCI) bus 120. It is noted that other local buses may be used, such as the VESA (Video Electronics Standards Association) VL bus. Various types of devices may be connected to the PCI bus 120. In the embodiment shown in FIG. 1, a hard disk 122 and a network interface controller 124 are coupled to the PCI bus 120. A SCSI (small computer systems interface) adapter 126 may also be coupled to the PCI bus 120, as shown. The SCSI adapter 126 may couple to various SCSI devices, such as a CD-ROM drive and a tape drive (both not shown), as desired. Isochronous peripheral devices such as a video monitor 114 and an audio digital-to-analog converter (audio DAC) 115 coupled to speakers 116 may be coupled to PCI bus 120. Various other devices may be connected to the PCI bus 120, as is well known in the art.

Expansion bus bridge logic 150 is also preferably coupled to the PCI bus 120. The expansion bus bridge logic 150 interfaces to an expansion bus 152. The expansion bus 152 may be any of varying types, including the industry standard architecture (ISA) bus, also referred to as the AT bus, the extended industry standard architecture (EISA) bus, or the microchannel architecture (MCA) bus. Various devices may be coupled to the expansion bus 152, such as expansion bus memory, isochronous peripheral devices or a modem (all not shown). The expansion bus bridge logic 150 also couples to a peripheral expansion bus (not shown). The peripheral expansion bus is used for connecting various peripherals to the computer system, including an interrupt system, a real time clock (RTC) and timers, a direct memory access (DMA) system, and ROM/Flash memory (all not shown). Other peripherals (not shown) are preferably connected to the peripheral expansion bus, including communications ports, diagnostics ports, command/status registers, and non-volatile static random access memory (NVSRAM).

Figure 2:
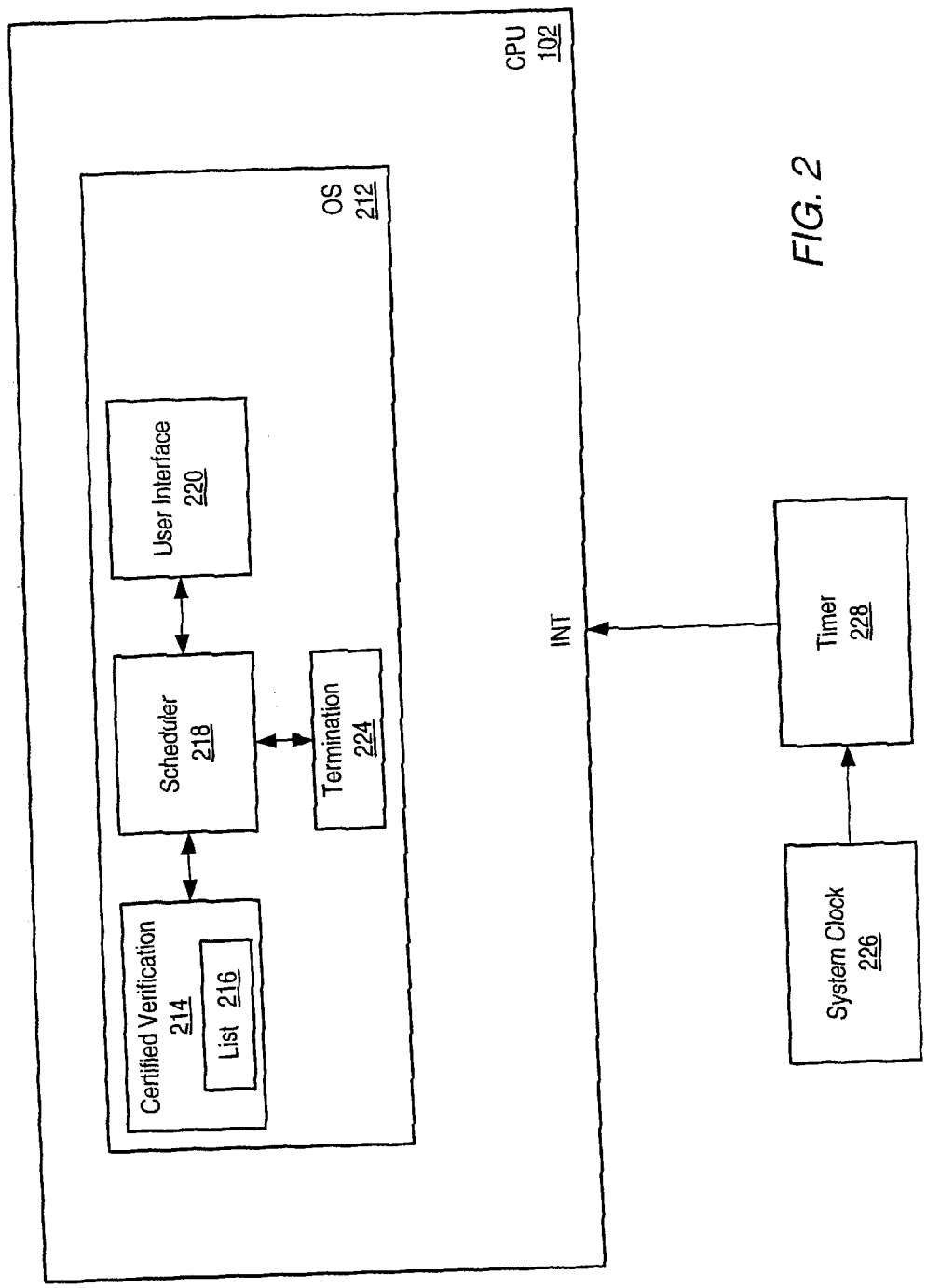
FIG. 2 is a block diagram of a portion of an operating system and interrupt generation circuitry according to one embodiment of the present invention.

Referring now to FIG. 2, a block diagram of a portion of an operating system and interrupt generation circuitry according to one embodiment of the present invention is shown. FIG. 2 includes CPU 102, system clock 226 and timer 228. CPU 102 includes operating system 212. Operating system 212 is configured to run on CPU 102. Operating system 212 handles tasks such as scheduling and file management. Portions of operating system 212 may be stored in memory (not shown). Operating system 212 includes a certified verification module 214, a scheduler 218, a user interface 220, and termination module 224. The certified verification module may include a list of certified isochronous tasks 216.

Timer 228 provides a real-time hardware interrupt to CPU 102. At a predefined interval, timer 228 outputs a signal that asserts an interrupt. This interrupt may be referred to as a time-slice interrupt. In one embodiment, the period of the time-slice interrupt is variable based on the interval of the currently executing isochronous tasks. Operating system 212 uses the time-slice interrupt to indicate when to start tasks.

In the illustrated embodiment, system clock 226 is coupled to timer 228. System clock 226 provides a stable clock signal to timer 228. Generally speaking, a system clock is a clock that provides a substantially stable clock to components of a computer system. System clock 226 may additionally provide a clock signal to external devices such as isochronous peripheral devices. The use of the same clock for peripheral devices and interrupts advantageously synchronizes the operating system with the devices that send or receive the isochronous data. This may eliminate a situation where the data from a peripheral device is not available when the operating system attempts to access the data, but arrives shortly after the operating system attempts to access the data. In other embodiments, other clocks may provide a stable clock signal to timer 228.

In one embodiment, timer 228 divides the system clock down to a lower frequency. For example, if the system clock is an 8 kHz clock, timer 228 may divide system clock 226 by eight to create a one millisecond interrupt. In other embodiments, system clock 226 may be divided in software. For example, the operating system may divide the system clock to create a time-slice interrupt.

When scheduler 218 receives a time-slice interrupt, it passes control to a pending isochronous task. At the completion of the isochronous task, control is passed back to scheduler 218. If another isochronous task is pending, scheduler 218 may pass control to that isochronous task. Once all pending isochronous tasks have executed, scheduler 218 may pass control back to the task that was interrupted by the time-slice interrupt. In one embodiment, scheduler 218 dynamically sets the timer so that the next time-slice interrupt occurs when the next non-pending isochronous task requires services. In this embodiment, an isochronous task will be pending at each occurrence of the time-slice interrupt. For example, assume two isochronous tasks are being serviced. The first task has an interval of twenty milliseconds and the second task has an interval of thirty milliseconds. The timer is originally set for an interval of twenty milliseconds. When the time-slice interrupt occurs, scheduler 218 sets the timer interval for ten milliseconds, and pass control to the first task. The next time-slice interrupt occurs ten milliseconds after the first time-slice interrupt. The scheduler sets the timer interval for twenty milliseconds and passes control to the second task. In an alternative embodiment, the timer interval may be fixed when applications are initialized. For example, in the above example, the timer interval may be reset to ten milliseconds. In this embodiment, when scheduler 218 receives a time-slice interrupt, it determines whether an isochronous task is pending. If an isochronous task is pending, scheduler 218 passes control to the task. If no isochronous tasks are pending, scheduler 218 returns control to the task that was interrupted.

Scheduler 218 may additionally output a signal to termination module 224 indicating the duration of an isochronous task. Termination module 224 may terminate a task that continues execution beyond the time allocated to that task. For example, if an isochronous task with a duration of one millisecond is executed and the isochronous task fails to finish within the specified duration, termination unit 224 may terminate the isochronous task so that another task may be executed. The termination of an isochronous task is discussed in more detail below in reference to FIG. 5.

Certified verification module 214 verifies that the tasks within an application are certified to be well-behaved before the application is initiated. It is noted that an application may include one or more isochronous tasks. An application is only certified if all isochronous tasks within an application are well-behaved. Because isochronous tasks have priority over non-isochronous tasks, it may be necessary to limit the portion of the operating system bandwidth available for the execution and isochronous tasks. Otherwise, the isochronous tasks may severely impact the performance of the non-isochronous tasks. It is further noted that initiation is distinct from execution. Initiation involves determining whether resources are available to execute an application and whether an application is suitable for execution. Execution is the performance of the task after it has been initiated.

To ensure the reliable operation of a computing system, isochronous tasks must be well-behaved, e.g., they must execute within a known duration. A non-well-behaved task can prevent scheduler 218 from executing other time critical tasks at the appropriate intervals. This situation can cause system crashes or corrupt the isochronous nature of the data. To ensure that the isochronous tasks of an application are well-behaved, each application may be certified to be well-behaved. It is noted that applications that do not include isochronous tasks do not have to be certified. Accordingly, the operating system supports both applications with isochronous tasks and non-isochronous applications that are not guaranteed to be well-behaved.

In one embodiment, a software vendor, such as an operating system vendor, may certify applications that include one or more isochronous tasks to be well-behaved, i.e., compliant with the rules governing isochronous tasks. The rules governing isochronous tasks may include: executing within a specified duration, providing a method to terminate the application, and not disabling interrupts.

In one particular embodiment, each certified application may be assigned a certification number. In the illustrated embodiment, list 216 stores a list of the certification numbers of certified applications. When an application is attempted to be initiated, certified verification module 214 may compare the certification number of the application to the list of certified applications to determine whether the application is certified. If an application is not certified, operating system 212 may not initiate the application. Alternatively, if the application is certified, certified verification module 214 may convey the information necessary to schedule the tasks of the application to scheduler 218. The information necessary to schedule a task may include the interval at which the task operates and the duration of the task. For example, a particular application may include a task that executes once every ten milliseconds and the duration of that task may be one millisecond.

In one embodiment, prior to initiating an application, scheduler 218 determines whether sufficient resources are available to execute the tasks of that application. As discussed above, the portion of the operating system bandwidth allocated to isochronous tasks may be limited. Accordingly, scheduler 218 may determine whether sufficient resources are available to service the tasks based upon the available portion of the operating system cycle for isochronous tasks and the resources used by other isochronous tasks. If sufficient resources are available, scheduler 218 schedules the isochronous tasks of the application. Alternatively, if sufficient resources are not available to execute the tasks, operating system 212 may not initiate the application.

In one embodiment, when an application is attempted to be initiated and insufficient resources are available, scheduler 218 may query a user via a user interface 220 for action to take. Generally speaking, a user interface is software and/or hardware that communicates with a user, or other entity, to obtain information. It is noted that the user may be another application or another computer system. For example, a user via user interface 220 may increase the percentage of the operating system bandwidth allocated to isochronous tasks. Alternatively, a user may select to disable an application currently executing to free resources for the execution of the new application.

Figure 3:
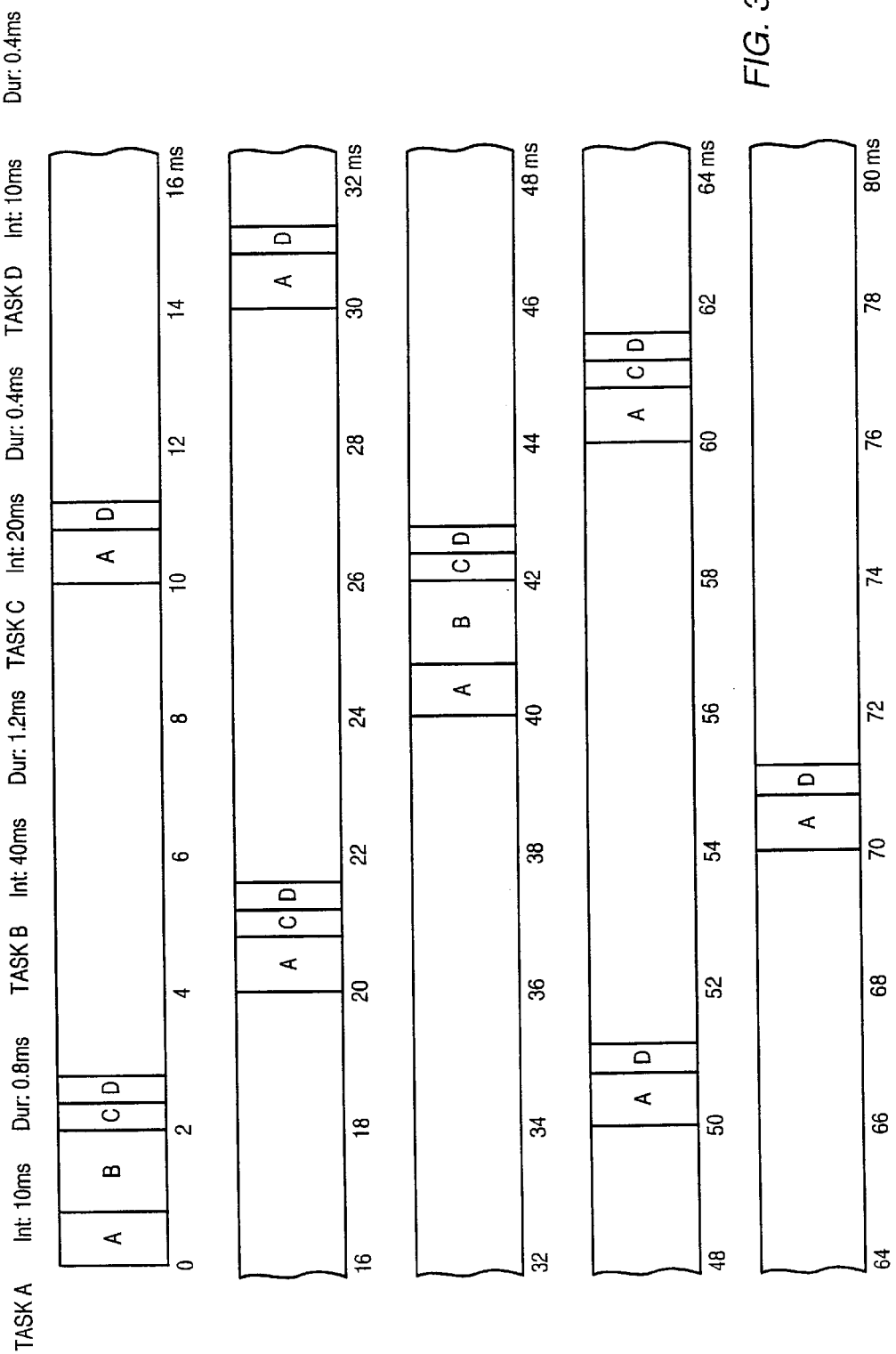
FIG. 3 is a diagram illustrating the scheduling of a plurality of isochronous tasks according to one embodiment of the present invention.

Turning now to FIG. 3, a diagram illustrating the scheduling of a plurality of isochronous tasks according to one embodiment of the present invention is shown. The embodiment shown in FIG. 3 includes a plurality of isochronous tasks labeled Task A—Task D. It is noted that Task A—Task D may be part of one application or part of a plurality of applications. Each task lists its interval and execution duration. The interval, or rate, specifies how often the isochronous task should be executed and the execution duration identifies the specified maximum execution time. Based upon the interval and the duration, operating system 212 can schedule the task. In the illustrated embodiment, the shortest interval of the isochronous tasks is ten milliseconds. Accordingly, a time-slice interrupt rate of ten milliseconds is chosen. It is noted that a time-slice interrupt rate less than the shortest interval could be chosen. It is further noted that the time-slice interval rate may vary in dependence upon the isochronous tasks currently being serviced.

Every ten milliseconds, the time-slice interrupt causes scheduler 218 to pass control to a pending isochronous task and notifies termination unit 224 of the specified maximum duration of the task. If the task executes within the specified maximum duration, then the task returns control to scheduler 218 at its completion. Alternatively, if the task is not completed within the specified maximum duration, then termination unit 218 terminates the task at the conclusion of the specified maximum duration and returns control to scheduler 218. When scheduler 218 receives control following an isochronous task, it determines if another isochronous task is pending. If another isochronous task is pending, scheduler 218 passes control to that isochronous task. Alternatively, if no additional isochronous task is pending, then scheduler 218 passes control to the task interrupted by the time-slice interrupt.

Task A has an interval of ten milliseconds and a duration of 0.8 milliseconds. Task B has an interval of forty milliseconds and a duration of 1.2 milliseconds. Task C has an interval of twenty milliseconds and a duration of 0.4 milliseconds. Task D has an interval of ten milliseconds and a duration of 0.4 milliseconds. At time equals zero milliseconds, a time-slice interrupt occurs. Scheduler 218 determines that isochronous Task A is pending and passes control to Task A. At the completion of Task A, control is passed back to scheduler 218, which determines that Task B is pending and passes control to Task B. At the completion of Task B, control is passed back to scheduler 218 which determines that Task C is pending and passes control to Task C. At the completion of Task C, scheduler 218 determines that Task D is pending and passes control to Task D. At the completion of Task D, scheduler 218 determines that no additional isochronous tasks are pending and may pass control to the interrupted task.

At time equal ten milliseconds, a second time-slice interrupt occurs and scheduler 218 again determines which isochronous tasks are pending. In the illustrated embodiment, Tasks A and D are executed once every ten milliseconds. Accordingly, scheduler 218 passes control to Task A. At the completion of Task A, control is passed back to scheduler 218, which passes control to Task D. At the completion of Task D, control is passed back to scheduler 218, which may pass control to the interrupted task. It is noted, that if a task completes within its specified maximum duration, the task passes control to scheduler 218 at the completion of the task. In one embodiment, if a task is not completed within the maximum specified duration, termination module 224 terminates the task and passes control to scheduler 218.

At time equals twenty milliseconds, a time-slice interrupt notifies scheduler 218 to determine which isochronous tasks are pending. In the illustrated embodiment, Tasks A, C and D are pending and scheduler 218 passes control to Tasks A, C and D sequentially. At time equals thirty milliseconds, another time-slice interrupt occurs and scheduler 218 passes control to Tasks A and D sequentially. At time equals forty milliseconds, another time-slice interrupt occurs and scheduler 218 passes control to Tasks A, B, C and D sequentially. At time equals fifty milliseconds, another time-slice interrupt occurs and scheduler 218 passes control to Tasks A and D sequentially. At time equals sixty milliseconds, another time-slice interrupt occurs and scheduler 218 passes control to Tasks A, C and D sequentially. At time equals seventy milliseconds, another time-slice interrupt occurs and scheduler 218 passes control to Tasks A and D sequentially.

In one embodiment, operating system 212 allows a user to specify the maximum percentage of operating system bandwidth allocated to isochronous tasks. For example, in the illustrated embodiment, Tasks A–D uses 17 percent of the available operating system bandwidth (Task A uses 8%, Task B uses 3%, Task C uses 2% and Task D uses 4%). Prior to initiating an application, the operating system may determine whether sufficient resources are available to execute the application. In one embodiment, the operating system determines whether executing the tasks of the application would exceed the percentage of the operating system bandwidth allocated to isochronous tasks. For example, if an application that includes one isochronous task (Task E) that executes every twenty milliseconds and has a duration of 0.8 milliseconds would require 4% of the operating system budget. If this application was attempted to be initiated, operating system 112 may determine that the execution of Task E in addition to Tasks A–D would consume 21% of the available operating system bandwidth. If the maximum percentage allocated to isochronous task is 20%, operating system 212 may not initiate the application that includes Task E.

As discussed above, in one embodiment operating system 212 may query a user to determine how to handle the application. The user may choose to increase the percentage of the operating system bandwidth allocated to isochronous tasks. For example, the user may increase the percentage of the operating system bandwidth allocated to isochronous tasks to 21% to allow the application that includes Task E to be initiated. Alternatively, the user may select to suspend execution of one of the currently executing applications. In the illustrated embodiment, suspending any of the applications that include an isochronous task would create sufficient resources to execute the application that includes Task E. Alternatively, the user may select not to initiate the application that includes Task E.

Figure 4:
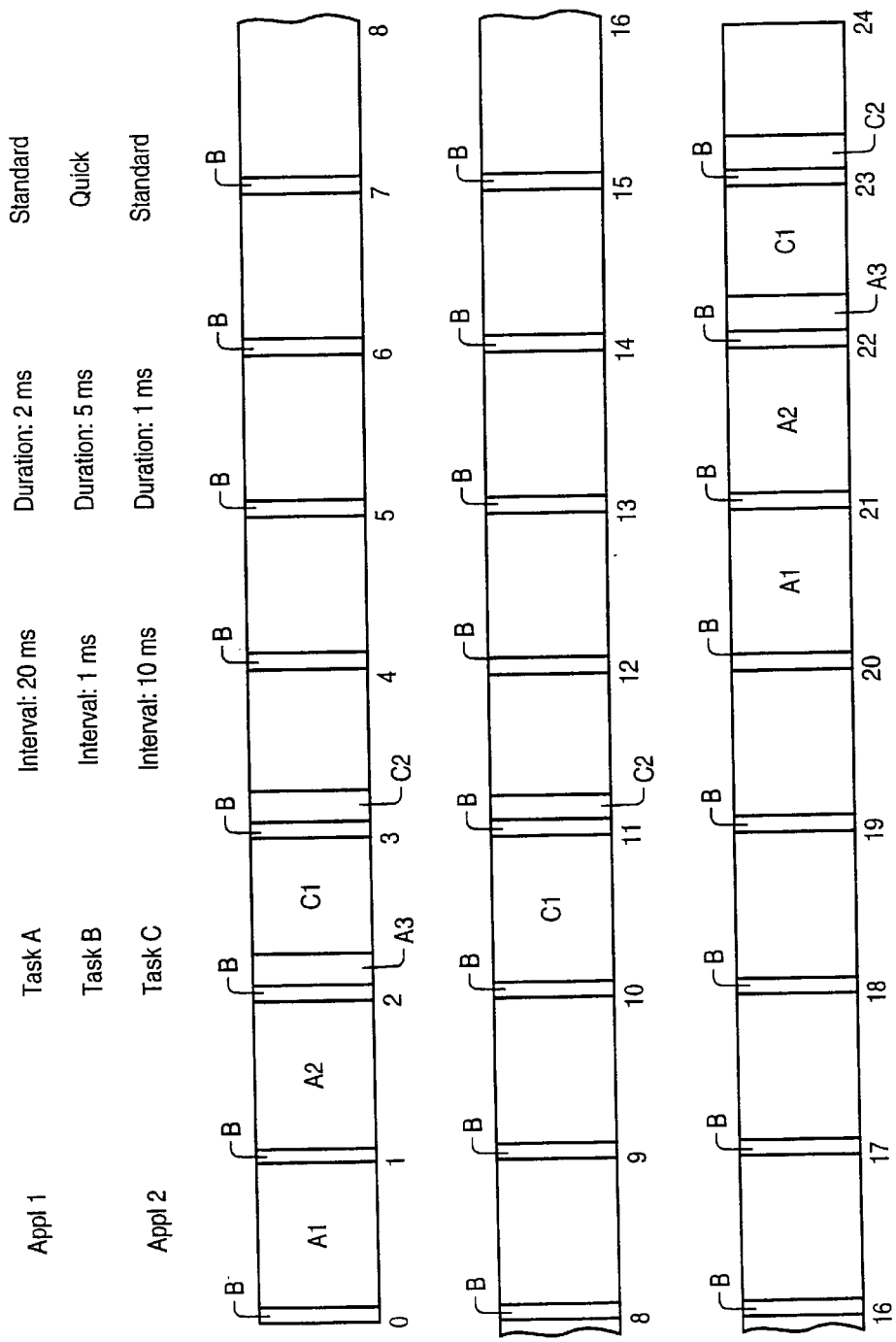
FIG. 4 is a diagram illustrating the scheduling of standard slices and quick slices according to one embodiment of the present invention.

Turning now to FIG. 4, a diagram illustrating the scheduling of standard slices and quick slices according to one embodiment of the present invention is shown. In the illustrated embodiment, two types of time-slices are utilized: standard slices and quick slices. Quick slices are typically allocated to higher priority task and are non-preemptable. Generally, preemption is the temporary suspension of a task in a manner in which the task can be resumed without corrupting the data. Standard slices are typically allocated to lower priority tasks and are preemptable. A standard slice may be preempted by a quick slice and resumed after the quick slice completes. Tasks allocated to standard slices may be a little more flexible then tasks allocated to quick slices. The tasks allocated to standard slices typically need to run at fairly regular intervals but can slip a little. Alternatively, tasks allocated to quick slices are typically very high priority and must execute at the specified intervals. In one embodiment, tasks allocated to quick slices do not disable interrupts.

When a time-slice interrupt occurs the operating system passes control to any quick slices first and then passes control to any standard slices. In one embodiment, tasks allocated to standard slices may assert a preemption flag indicating that the task has been preempted one or more times. The preemption flag is provided to the operating system and may cause the operating system to give the task higher priority. In one particular embodiment, when a preemption flag is set, the task becomes non-preemptable the next time it is invoked.

In the illustrated embodiment, Tasks A and C are allocated to standard slices and Task B is allocated to quick slices. Task A has a interval of twenty milliseconds and a duration of two milliseconds. Task B has an interval of one millisecond and duration of ten microseconds In one embodiment, quick slices have a fixed standard duration. Because quick slices are relatively short, the overhead to determine the duration and set the timer may be impractical. Task C has an interval of ten milliseconds and a duration of one millisecond. FIG. 4 illustrates one possible scheduling of Tasks A–C. In the illustrated embodiment, the shortest interval of the scheduled task is one millisecond. Accordingly, a period of the time-slice interrupt is one millisecond.

Every millisecond, the time-slice interrupt is provided to scheduler 218 which passes control to Task B which is a quick-slice task. Task B executes and passes control back to scheduler 218 which passes control to Task A which is a standard slice task. Task A begins execution. At time equal one millisecond, the time-slice interrupt is again provided to scheduler 218. Scheduler 218 determines that Task B is a quick-slice task scheduled to be executed. Accordingly, scheduler 218 preempts Task A which is a standard slice and passes control to Task B. After Task B completes, it passes control back to scheduler 218, which passes control to Task A. Task A continues execution from the point where it was previously preempted and continues executing until scheduler 218 preempts Task A again at time equal two milliseconds. Scheduler 218 passes control to Task B which executes and returns control to scheduler 218. Scheduler 218 passes control back to Task A which completes execution and returns control to scheduler 218. Scheduler 218 passes control to Task C, which is a standard slice task. Task C executes until the next time-slice interrupt at which point scheduler 218 passes control to Task B, which executes and returns control to scheduler 218. Scheduler 218 passes control to Task C, which completes execution and returns control to scheduler 218. Because no isochronous tasks are scheduled to be executed, scheduler 218 may pass control to a task interrupted at time equals zero. Each subsequent time-slice interrupt, scheduler 218 passes control to Task B which completes execution and returns control to scheduler 218. At time equals ten milliseconds, scheduler 218 passes control to Tasks B and C, sequentially. Task C executes until the subsequent time-slice interrupt at which time Task C is preempted and control is passed to Task B. At the completion of Task B, control is returned to Task C, which completes execution and returns control to scheduler 218. Scheduler 218 may then pass control the task interrupted at time equal ten milliseconds.

In one embodiment, quick slices have a shorter interval than standard slices. For example, standard slices may be scheduled on ten millisecond boundaries (e.g., ten milliseconds, twenty milliseconds, thirty milliseconds, etc.). Quick slices may be scheduled on one millisecond boundaries. The duration of quick slices may be fixed and the duration of standard slices may be limited by the operating system. In one embodiment, the duration of quick slices is fixed at ten microseconds.

Figure 5:
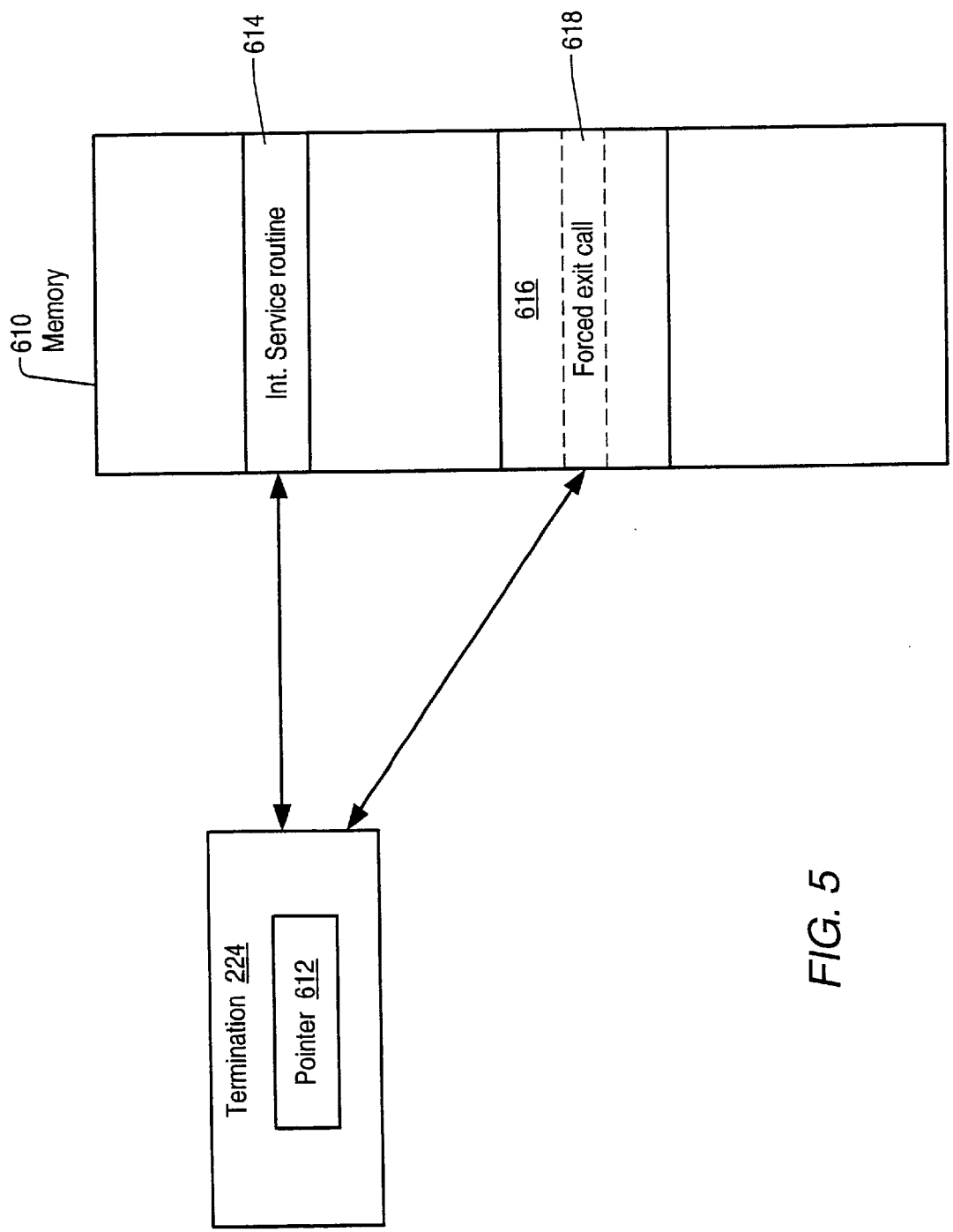
FIG. 5 is a block diagram illustrating the execution of a forced exit call according to one embodiment of the present invention.

Turning now to FIG. 5, a block diagram illustrating the execution of a forced exit call according to one embodiment of present invention is shown. To ensure consistent operation of the computer system, a method of reliably terminating tasks that are currently executing is implemented. It is noted that termination is distinct from preemption. Preemption is the normal suspending of a task so that another task may begin executing. For example, in FIG. 4, Task A is preempted to allow Task B to execute. Termination is the stoppage of a task due to an unexpected condition. For example, a task may continue execution beyond the duration specified for the task.

A mechanism is included to ensure that any task may be terminated by the operating system. The need to terminate a task may arise due to an error within the task or the system may be designed to terminate a task. For example, a task may have an execution time that varies due to system conditions. The task may execute within a first duration a large portion of the time, but exceeds that duration on occasion. Rather than scheduling the task for the maximum possible duration, that task may be scheduled for the first duration and rely on the operating system to terminate the task the small percentage of the time that it exceeds the first duration. It is noted that a method of terminating tasks may be desirable even in systems with tasks that are certified to be well-behaved. Unexpected occurrences or errors may cause a task to execute beyond its specified duration.

In one embodiment, each isochronous task includes a forced exit call which may be invoked by the operating system to terminate the task. The forced exit call will cause a task to cleanly exit. Generally speaking, cleanly exiting may include storing critical data and exiting the task. In one embodiment, time allocated to storing critical data is limited so that the task is quickly exited. Critical data may include data necessary to resume the task.

In one embodiment, termination is initiated by an interrupt from operating system 212. When control is passed to a task, scheduler 218 conveys information to termination unit 224 indicative of the maximum duration of the task. If the task does not complete within the specified maximum duration, termination unit 224 may invoke an interrupt to terminate the task. In one embodiment, the interrupt invoked is a non-maskable interrupt. In one embodiment, an existing non-maskable interrupt may be used, but precautions are taken to prevent the modification of the interrupt service routine associated with the non-maskable interrupt. In one particular embodiment, the interrupt service routine is stored in the basic input/output system (BIOS) code of the computer system. Storing the interrupt service routine in BIOS prevents the routine from being modified or changed. In an alternative embodiment, a new interrupt is used to terminate a task rather than modifying the existing non-maskable interrupt. The new interrupt cannot be masked nor can the interrupt service routine be modified. In one embodiment, the scheduler invokes the interrupt and the interrupt service routine terminates the currently executing task.

The first operation by the interrupt service routine is to service the termination of a task. Termination unit 224 may include an interrupt service routine pointer 612 that identifies the storage location 614 of the interrupt service routine. Because BIOS is typically copied to memory during operation, the location of the interrupt service routine may differ. When the interrupt service routine is copied to memory, the location of the routine may be stored to pointer 612. In the illustrated embodiment, pointer 612 points to location 614. Operating system 212 begins executing the interrupt service routine stored at location 614 of memory 610. In one embodiment, the interrupt service routine calls the forced exit call 618 of the current task 616. As discussed above, the forced exit call causes the task to cleanly exit. It is noted that terminating the isochronous task may corrupt the terminated task, but helps ensure that the operating system timely executes other tasks.

Figure 6:
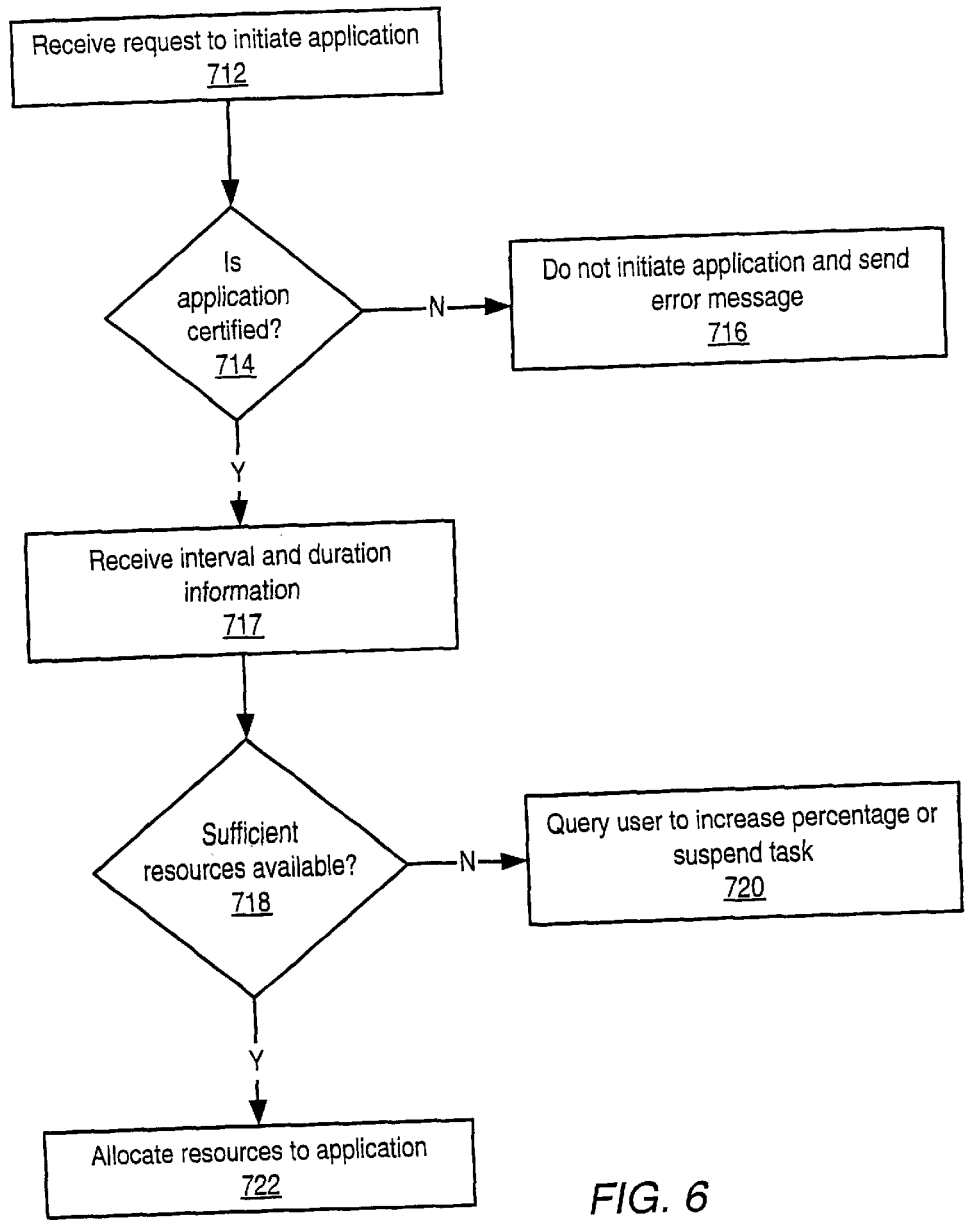
FIG. 6 is a flowchart diagram illustrating the initiation of an application according to one embodiment of the present invention.

Turning now to FIG. 6, a flowchart diagram illustrating the initiation of an application is shown. In step 712, the operating system receives a request to initiate an application. The application may include a plurality of isochronous tasks. In step 714, it is determined whether the application is certified. In one embodiment, certification entails verifying that the tasks within the application are well-behaved. Generally speaking, well-behaved tasks do not violate system rules for isochronous tasks. Examples of rules for isochronous tasks are: executing within a predetermined duration, not disabling interrupts, and/or including a forced exit call to terminate the task. In one particular embodiment, the operating system stores a list of certification numbers of certified applications. In this embodiment, the operating system may determine whether an application is certified by comparing the certification number of the application to the list of certified applications.

If in step 714 it is determined that the application is not certified, then in step 716 the operating system does not initiate the application and may send an error message indicating that the application is not certified. Alternatively, if it is determined that the application is certified, then in step 717 a scheduler receives the interval and duration of the tasks within the application. In one embodiment, the interval defines the rate at which the tasks are executed. For example, a task with an interval of ten milliseconds is executed once every ten milliseconds. The duration identifies the maximum execution time of the task. Most well-behaved tasks will complete execution within the defined duration so that the operating system is able to execute another task scheduled subsequent to that task. As discussed above, in one particular embodiment, a task with varying execution time may have a duration that is not sufficient to complete the execution of the task in all instances. In this embodiment, the operating system uses a termination procedure to terminate the task at the end of the defined maximum execution time.

In step 718, the operating system determines whether sufficient resources are available to execute the tasks of the application. In one embodiment, the operating system determines whether sufficient resources are available by determining the maximum percentage of the operating system bandwidth allocated to isochronous tasks compared to the percentage currently used by isochronous tasks. If sufficient resources are available, then in step 722 the operating system allocates the resources to the isochronous tasks of the application. Alternatively, if sufficient resources are not available to execute the tasks, then in step 720 the operating system queries the user to determine the appropriate response. As discussed above, the user may select to increase the percentage of the operating system bandwidth allocated to isochronous tasks, to suspend a current application to make resources available for the new application, or to not initiate the new application.

Figure 7:
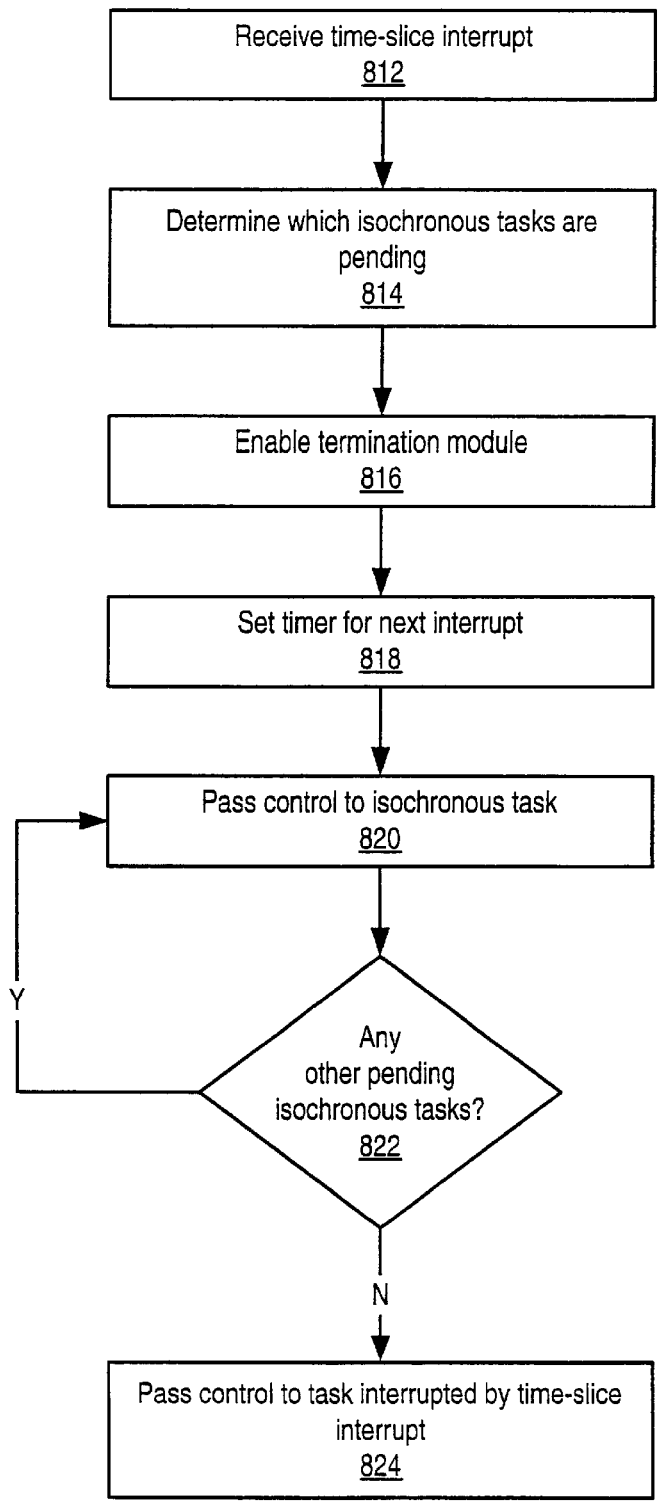
FIG. 7 is a flowchart diagram illustrating the execution of an isochronous task according to one embodiment of the present invention.

Turning now to FIG. 7, a flowchart diagram illustrating the execution of an isochronous task according to one embodiment of the present invention is shown. In step 812, the operating system receives a time-slice interrupt. In step 814, it is determined which isochronous tasks are pending. In step 816, a termination module is enabled. The termination module is configured to terminate a task that continues execution beyond its specified maximum duration. In one embodiment, a scheduler notifies the termination module of the specified maximum duration of a task. If the task does not complete within its maximum duration, the termination module interrupts the task and returns control to the scheduler.

In step 818, a timer for the next time-slice interrupt is set. The timer specifies the duration between time-slice interrupts. The duration may change after each interrupt. For example, assume two tasks are initiated. The first task executes every twenty milliseconds and the second task executes every thirty milliseconds. The first time-slice interrupt occurs at twenty milliseconds and the timer is set for ten milliseconds. The next time-slice interrupt occurs at thirty milliseconds and the timer is set for ten milliseconds. The next time slice interrupt occurs at forty milliseconds and the timer is set for twenty milliseconds.

In step 820, control is passed to a first isochronous task. When the first isochronous task completes execution, then in step 822, it is determined whether any other isochronous tasks are pending. Steps 820 and 822 are repeated until no isochronous tasks are pending. In step 824, control is returned to the task interrupted by the time-slice interrupt in step 812.

Numerous variations and modifications will become apparent to those skilled in the art once the above disclosure is fully appreciated. It is intended that the following claims be interpreted to embrace all such variations and modifications.

What is claimed is:

1. A computer system, comprising:
    a processor configured to run a non-real-time operating system and to receive a periodic time-slice interrupt;
    a memory coupled to the processor and configured to store the non-real-time operating system; and
    interrupt generation circuitry coupled to the processor and configured to generate the periodic time-slice interrupt;
    wherein the non-real-time operating system is configured to initiate execution of a pending isochronous task in a first type or a second type of time slices when the processor receives the periodic time-slice interrupt;
    wherein if a time slice allocated to the pending isochronous task is of the first type, the non-real-time operating system is configured to initiate execution of the task in such a way that the task is non-preemptable; and
    wherein if the time slice allocated to the pending isochronous task is of the second type, the non-real-time operating system is configured to initiate execution of the task in such a way that the task is preemptable.

2. The computer system of claim 1, wherein the first type of time slices has a shorter interval between time slices than the second type of time slices.

3. The computer system of claim 1, wherein the first type of time slices have a shorter duration than the second type of time slices.

4. The computer system of claim 1, wherein if a plurality of isochronous tasks are pending when the processor receives the periodic time-slice interrupt, the non-real-time operating system is configured to initiate execution of a higher priority pending isochronous task allocated one of the first type of time slices before initiating execution of a lower priority pending isochronous task allocated one of the second type of time slices.

5. The computer system of claim 1, wherein if an isochronous task allocated one of the second type of time slices is executing when the processor receives the periodic time-slice interrupt and if the pending isochronous task is allocated one of the first type of time slices, the non-real-time operating system is configured to interrupt the executing isochronous task and to initiate execution of the pending isochronous task.

6. The computer system of claim 5, wherein an isochronous task allocated to the second type of time slices is configured to assert a flag indicating that the isochronous task allocated to the second type has previously been preempted, and wherein the non-real-time operating system is configured to initiate execution of the isochronous task having the flag asserted as non-preemptable the next time it is initiated.

7. The computer system of claim 1, further comprising:
    a local bus coupled to the processor; and
    one or more isochronous peripheral devices coupled to the local bus and configured to send or receive isochronous data according to the pending isochronous task.

8. A method of executing a plurality of isochronous tasks, comprising:
    allocating a first type of time slices to one or more higher priority isochronous tasks;
    allocating a second type of time slices to one or more lower priority isochronous tasks;
    receiving a periodic time-slice interrupt;
    determining if any isochronous tasks are pending when the periodic time-slice interrupt is received;
    if an isochronous task allocated the first, type of time slice is pending, initiating execution of that isochronous task in such a way that the isochronous task allocated the first type of time slice is not preemptable during execution; and
    if an isochronous task allocated the second type of time slice is pending and no isochronous task allocated the first type of time slice is pending or executing, initiating execution of the isochronous task allocated the second type of time slice.

9. The method as recited in claim 8, wherein the first type of time slice has a shorter interval between time slices than the second type of time slice.

10. The method as recited in claim 8, wherein the first type of time slice has a shorter duration than the second type of time slice.

11. The method as recited in claim 8, further comprising, if a plurality of isochronous tasks are pending, initiating execution of the isochronous tasks allocated the first type of time slice before initiating execution of the isochronous tasks allocated the second type of time slice.

12. The method as recited in claim 8, further comprising interrupting execution of an executing isochronous task allocated a second type of time slice if, when the periodic time-slice interrupt is received, an isochronous task allocated the first type of time slice is pending.

13. The method as recited in claim 12, further comprising:
    an isochronous task allocated to the second type of time slice asserting a flag indicating that it has previously been preempted; and
    the next time the isochronous task having an asserted flag is initiated, initiating it so that its execution is non-preemptable.

* * * * *

UNITED STATES PATENT AND TRADEMARK OFFICE
CERTIFICATE OF CORRECTION

PATENT NO. : 6,766,347 B1  Page 1 of 1
DATED : July 20, 2004
INVENTOR(S) : Dale E. Gulick It is certified that error appears in the above-identified patent and that said Letters Patent is hereby corrected as shown below:

<u>Title page, Item [54] and Column 1, lines 1-3</u>
Title, please delete "SYSTEM AND METHOD FOR PROVIDING A REMOTE USER WITH A VIRTUAL PRESENCE TO AN OFFICE", and insert -- BI-LEVEL ISOCHRONOUS TASK SCHEDULING --

Signed and Sealed this

Nineteenth Day of October, 2004

JON W. DUDAS
*Director of the United States Patent and Trademark Office*